US006581017B2

(12) United States Patent
Zumkehr

(10) Patent No.: US 6,581,017 B2
(45) Date of Patent: Jun. 17, 2003

(54) SYSTEM AND METHOD FOR MINIMIZING DELAY VARIATION IN DOUBLE DATA RATE STROBES

(75) Inventor: John F. Zumkehr, Orange, CA (US)

(73) Assignee: Intel Corporation, Santa Clara, CA (US)

( * ) Notice: Subject to any disclaimer, the term of this patent is extended or adjusted under 35 U.S.C. 154(b) by 161 days.

(21) Appl. No.: 09/892,666

(22) Filed: Jun. 28, 2001

(65) Prior Publication Data

US 2003/0004667 A1 Jan. 2, 2003

(51) Int. Cl.[7] .................................................. G11C 7/00

(52) U.S. Cl. ........................ 702/107; 365/194; 327/241

(58) Field of Search ................................ 365/193, 194, 365/195, 233.5; 327/273, 241; 713/401; 702/107

(56) References Cited

U.S. PATENT DOCUMENTS 6,292,097 B1 * 9/2001 Tewell ........................ 340/471
6,316,980 B1 * 11/2001 Vogt et al. .................. 327/273
6,456,544 B1 * 9/2002 Zumkehr .................... 365/193

* cited by examiner

*Primary Examiner*—Kamini Shah
(74) *Attorney, Agent, or Firm*—Antonelli, Terry, Stout & Kraus, LLP

(57) ABSTRACT

A system and method in which delay strobe variation in a double data rate device is calibrated by first individually calibrating all slave strobe delay devices at system startup. Thereafter, a master strobe delay device is activated periodically to determine an incremental delay adjustment. This incremental delay adjustment is then used to by the slave strobe delay devices to modify the calibration value performed by the slave strobe delay devices upon startup. In this manner, individual on-die variations are compensated for each slave strobe delay device and variations due to voltage and temperature changes are compensated for without effecting the normal operation of the slave strobe devices.

19 Claims, 4 Drawing Sheets

400
POWER-ON
410
CALIBRATE EACH DELAY LINE INDIVIDUALLY FOR DESIRED DELAY
420
TIME FOR MASTER RECALIBRATE?
NO
YES
430
CALIBRATE MASTER AND DETERMINE INCREMENTAL CONTROL CHANGE
440
INCREMENTAL CONTROL CHANGE NOT = 0?
YES
NO
450
ADJUST SLAVE CONTROL VALUES WITH SAME INCREMENT

DQS
100
MUX
300
VARIABLE DELAY ELEMENT
305
SPLITTER
310
315
320
210
ODD FLOP
EVEN FLOP
BIT 0
BIT 1
BIT 3
338
340
345
350
355
360
365
370
DELAY CONTROL
330
FREQUENCY COUNTER
335
INCREMENTAL DELAY ADJUSTMENT
220
DQ[3:0]
110
DQEV[3:0]
375
DQOD[3:0]
380

400
POWER-ON
410
CALIBRATE EACH DELAY LINE INDIVIDUALLY FOR DESIRED DELAY
420
TIME FOR MASTER RECALIBRATE?
NO
YES
430
CALIBRATE MASTER AND DETERMINE INCREMENTAL CONTROL CHANGE
440
INCREMENTAL CONTROL CHANGE NOT = 0?
YES
NO
450
ADJUST SLAVE CONTROL VALUES WITH SAME INCREMENT

SYSTEM AND METHOD FOR MINIMIZING DELAY VARIATION IN DOUBLE DATA RATE STROBES

FIELD

The invention relates to a system and method for minimizing delay variation between multiple double data rate strobes. More particularly, the present invention enables the calibration of circuits used to transfer data from memory to a memory controller upon system startup to control for on-die variations in the circuits and to periodically re-calibrate the circuits to compensate for voltage and temperature variations seen during operation of the circuit with minimal interference in the normal transfer of data from memory to the memory controller.

BACKGROUND

In the rapid development of computers many advancements have been seen in the areas of processor speed, throughput, communications, and fault tolerance. Microprocessor speed is measured in cycles per second or hertz. Today=s high-end 32-bit microprocessors operate at over 1.7 Ghz (gigahertz), 1.7 billion cycles per second, and in the near future this is expected to go substantially higher 2.6 and 3.3 Ghz and beyond. At this sort of cycle speed a clock would have to generate a pulse or cycle at least ten times each billionth of a second and usually significantly faster.

With processors operating at such higher rates it is necessary to supply data to the processor when required from memory at a comparable rate otherwise a bottle neck is formed and the processor spends much of its time waiting for data.

One method, as shown in FIG. 1, utilized to improve the transfer rate of memory utilizes Double Data Rate (DDR) devices to transfer data at both the leading edge of a clock cycle and the trailing edge of the clock cycle. These DDR devices have a source-synchronous clocking protocol to transfer data from the memory to the memory controller. Data (DQ) 110 from memory is captured by the memory controller using a clock (DQS) 100 supplied by the memory devices. However, in order to avoid DQ 110 errors which may occur when the DQS 100 signal levels change, each DQS 100 from memory is delayed, as shown in FIG. 1 in the delayed DQS 120 signal, so that data can be clocked in the center of the valid data window. The precision of the strobe delay 130 is important because any variation in the strobe delay 130 translates into added setup/hold time for the memory controller. If the setup/hold time is too large, the system becomes unworkable. This is especially true as DDR technology moves to faster speeds.

There are several methods available to generate a precise delay. Most all of these methods involve a delay element that can be calibrated to a precise delay for the DQS 100 signal. The calibration adjusts controls in the delay element so that a precise delay strobe 130 can be given regardless of the microcircuit process parameters, temperature, and voltage. How these delay strobes 130 are calibrated will determine how much variation can occur.

One method employed to calibrate the delay strobe 130 uses a master/slave approach where a master delay element is continuous calculating the control settings needed by the slave delay elements. The master is never used to delay actual strobes from the DDR devices because it is used exclusively for updating the slave delay element controls. The slaves are used for the actual strobe delay, but are never used for calibration since that it would reduce availability for memory transactions. This creates a problem if there is on-die variation that causes the characteristics of the master delay element to be different from that of the slave delay element. The master may be precisely set to the desired delay but the slaves can vary enough to cause a problem for higher speed DDR devices.

One solution to this problem would be to calibrate each delay line individually without a master/slave scheme. On-die variation in process parameters would be taken into account as well as the current voltage and temperature giving a precise delay. However, the voltage and temperature of the delay line will change as the circuit is operated and the delay will no longer be at the precise delay that is needed by the DDR device. To compensate for this, periodically the delay elements could be re-calibrated to the correct control setting, but this would prevent memory read transactions from occurring during re-calibration. If temperature and voltage vary frequently, it may be necessary to do more calibrations, which will further reduce the availability to memory which reduces performance of the system.

Therefore, what is needed is a system and method in which the delay strobe 130 be calibrated to take into consideration on-die variations in individual circuits as well as variations which occur due to changes in voltage and temperature. This system and method should have minimal, if any, impact in transfer operations to and from memory.

BRIEF DESCRIPTION OF THE DRAWINGS

The foregoing and a better understanding of the present invention will become apparent from the following detailed description of exemplary embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and the invention is not limited thereto. The spirit and scope of the present invention are limited only by the terms of the appended claims.

The following represents brief descriptions of the drawings, wherein.

DETAILED DESCRIPTION

Figure 1:
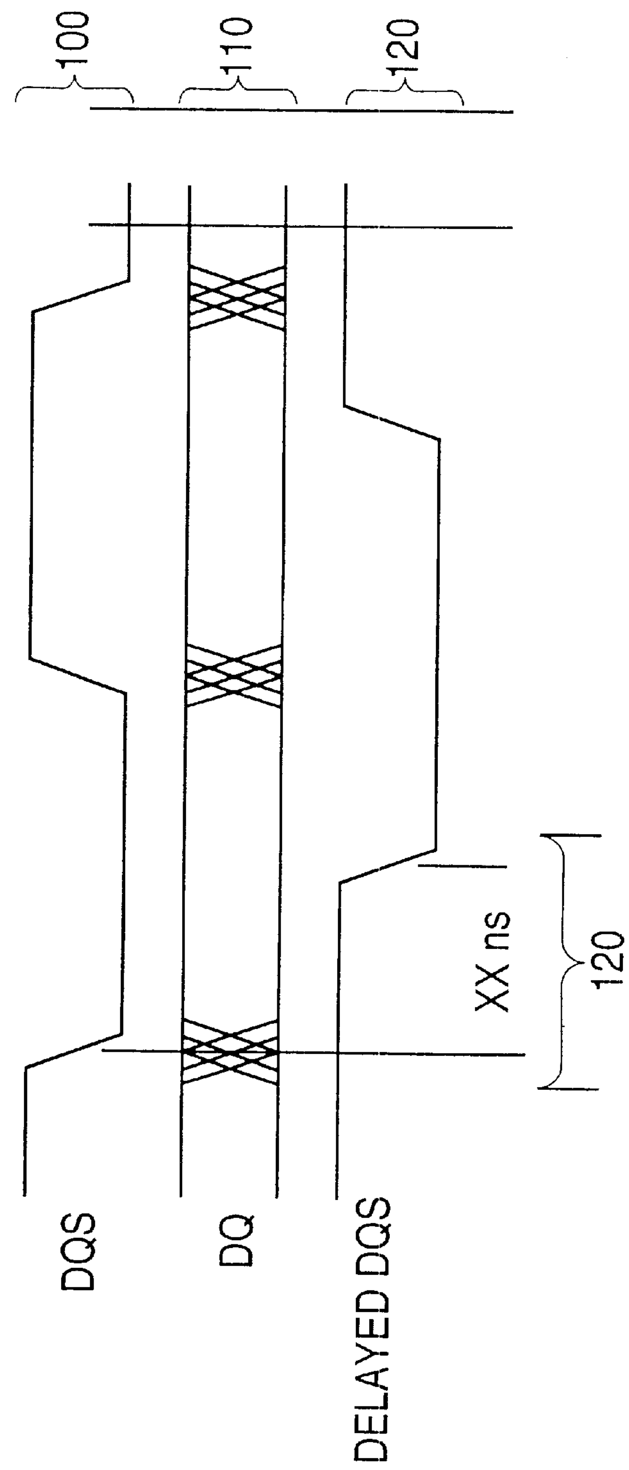
FIG. 1 is a diagram of the signal seen in a DDR device.

Before beginning a detailed description of the subject invention, mention of the following is in order. When appropriate, like reference numerals and characters may be used to designate identical, corresponding or similar components in differing figure drawings. Further, in the detailed description to follow, exemplary sizes/models/values/ranges may be given, although the present invention is not limited to the same. As a final note, well-known components of computer networks may not be shown within the FIGs. for simplicity of illustration and discussion, and so as not to obscure the invention.

Figure 2:
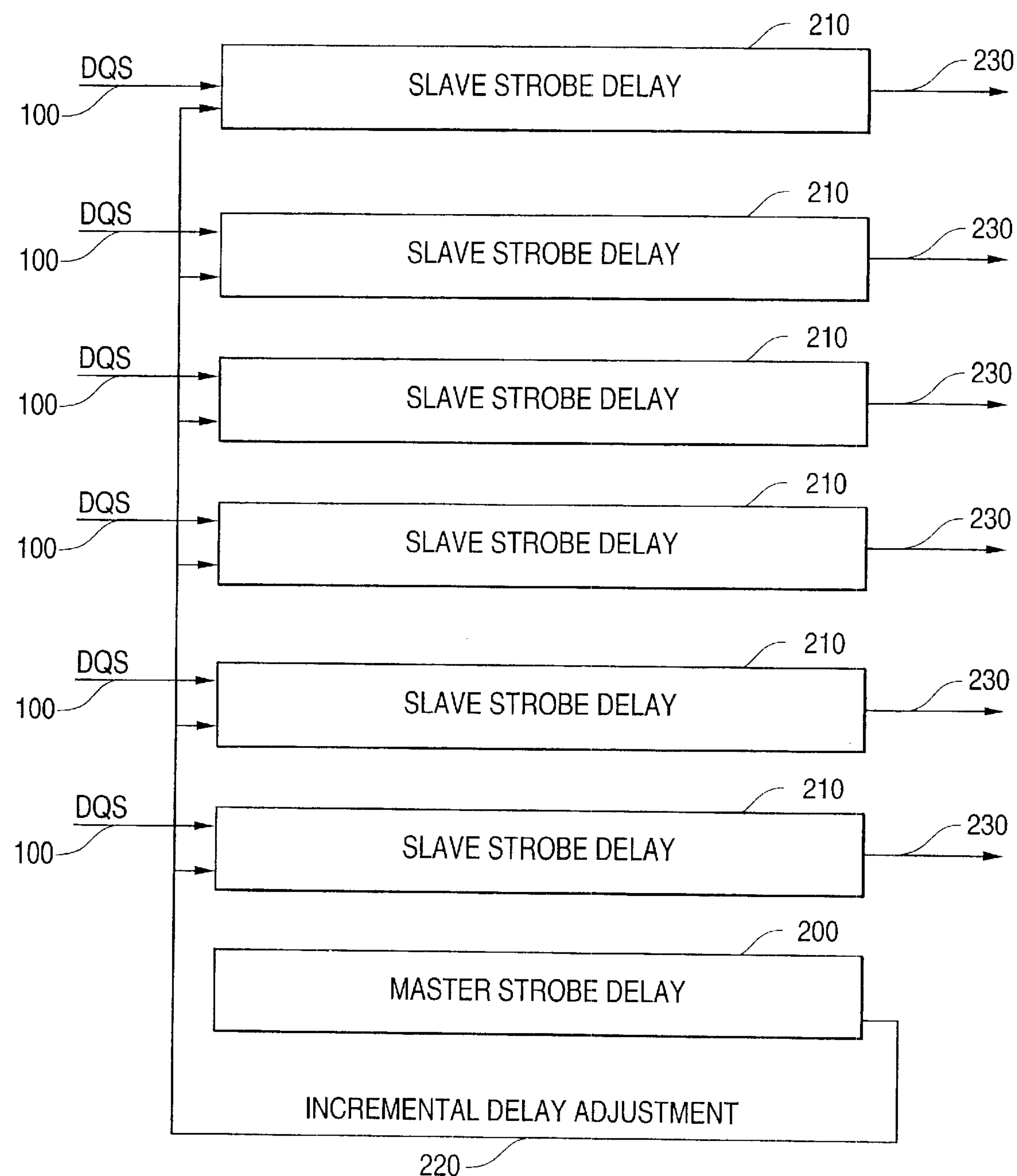
FIG. 2 is a hardware block diagram illustrating the interconnection between a master strobe delay device and slave strobe delay devices utilized in example embodiment of the present invention.

FIG. 2 is a hardware block diagram illustrating the interconnection between a master strobe delay device 200 and slave strobe delay devices 210 utilized in example embodiment of the present invention. In this embodiment of the present invention a hybrid approach to calibrating the strobe delay 130 signal is used by initially calibrating each slave strobe delay device 210 individually at system startup to compensate for on-die process variation and then using a master strobe delay device 200 to compensate for minor changes in the strobe delay 130 signal caused by changes in temperature and voltage. These on-die process variations are due to minuscule variations seen in the circuit manufacturing process. These on-die process variations have become more significant as clock cycle periods have decreased due to increases in the number of cycles per second (CPS) seen in processor and memory speed.

Still referring to FIG. 2, the master strobe delay device 200 is used to measure the incremental change that has occurred in the slave strobe delay devices 210 due to voltage and temperature that is then used to incrementally adjust the slave strobe delay devices 210 accordingly via an incremental delay adjustment signal 220. As will be discussed in further detail in FIG. 3, the slave strobe devices 210 and the master strobe device 200 are similar except for the incremental delay adjustment signal 220 being supplied by the master strobe delay device 200 to each of the slave strobe delay devices 210 and the absence of a DQ output signal 230 from the master strobe delay device 200 which is provided by the slave strobe delay devices 210. Further, the master strobe delay device 200 differs from the slave strobe devices 210 by not receiving a DQS 100 signal. Otherwise, the master strobe delay device 200 and the slave strobe delay devices 210 are similar so that any variation seen by the master strobe delay device 200 due to temperature or voltage changes would be the same as those seen by the slave strobe delay devices 210.

Still referring to FIG. 2, it should be noted that one master strobe delay device 200 is connected to six slave strobe delay devices 210 via the incremental delay adjustment 220 signal. However, as would be appreciated by one of ordinary skill and art, the number of slave strobe delay devices 210 connected to the master strobe delay device 200 may vary based upon design requirements.

Figure 3:
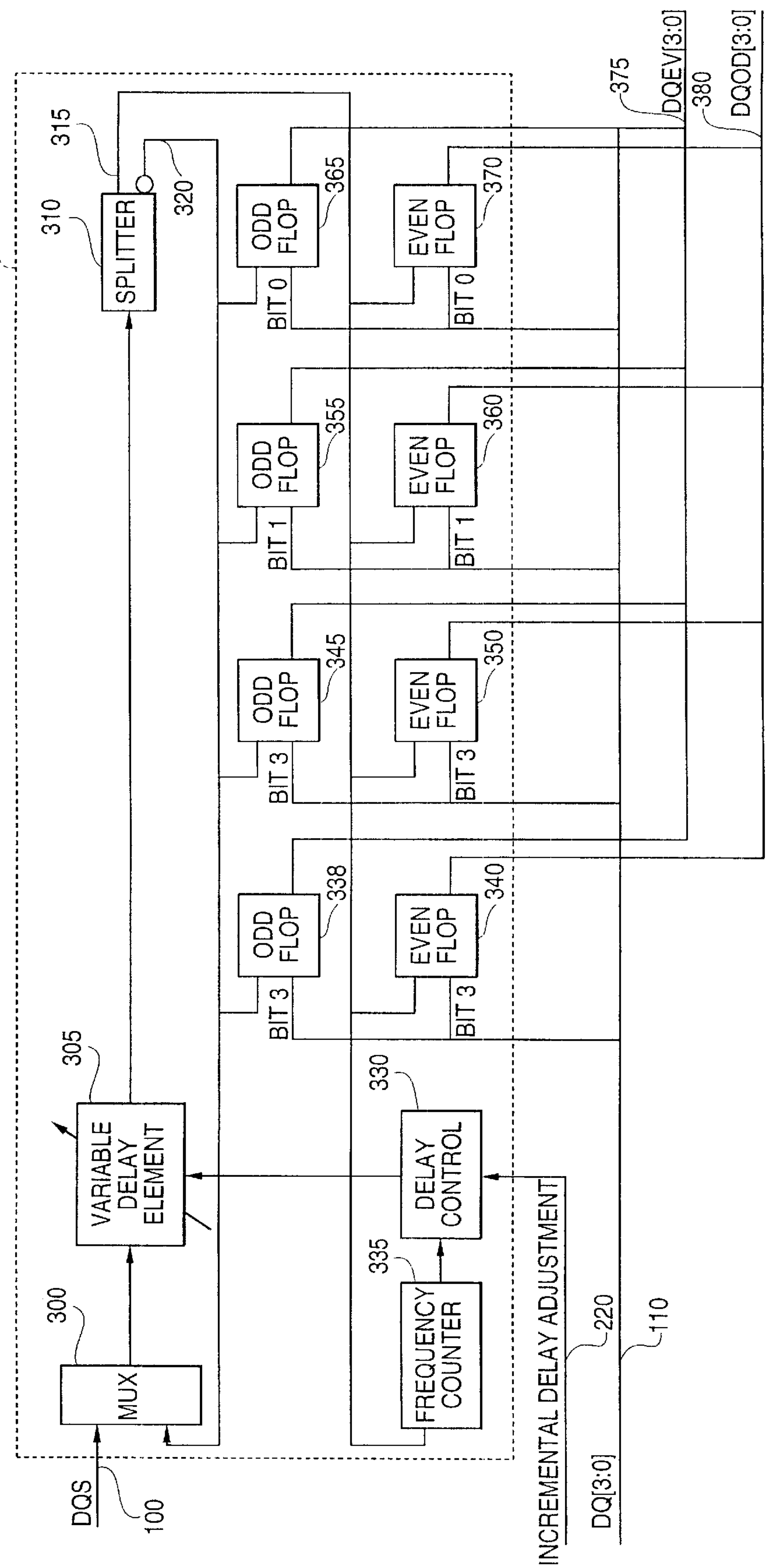
FIG. 3 is a hardware diagram of a master or slave strobe delay device employed in an example embodiment of the present invention.

FIG. 3 is a hardware diagram of a slave strobe delay device 210 employed in an example embodiment of the present invention. As previously discussed the slave strobe delay device 210 is similar to the master strobe delay device 200 with noted exceptions. The slave strobe delay device 210 receives a DQS 100 signal and selects it or an inverted output signal 320 via Multiplexer 300. Multiplexer 300 selects input to variable delay element from the normal source (DQS 100) or from a feedback (inverted signal 320) to form an oscillator needed for calibration. The output from multiplexer 300 is transmitted to variable delay output 305 which upon system startup and contains the individual adjustment required for this particular slave strobe delay device 210 to generate strobe delay 130. The output from variable delay element 305 is input to splitter 310 which generates two signals. The first signal 315 is output to frequency counter 335 and even flops 340, 350, 360, and 370 which will be discussed in further detail ahead. The second signal 320 is an inverted signal which is input to multiplexer 300 and odd flops 338, 345, 355, and 365 which will be discussed in further detail ahead.

Still referring to FIG. 3, frequency counter 335 measures the frequency of the oscillator formed by using the slave strobe delay device 210. By determining the frequency of the slave strobe delay device 210 oscillator, the current delay value of the slave strobe delay device 210 can be determined at system startup. The output from frequency counter 335 is input to delay control unit 330 where incremental delay adjustment 220 is also input from the master strobe delay device 200. It should be noted that the master strobe delay device 200 determines the incremental delay adjustment utilizing its own frequency counter 335. The delay control unit 330 then adds the incremental delay adjustment 220 to the value received from the frequency counter 335 and inputs that to the variable delay element 305 so that the appropriate strobe delay 130 can be determined.

Still referring to FIG. 3, it should be noted that DQ signal 110 is also input to slave strobe delay device 210 and comprises four bits. Bit 3 of DQ 110 is input to odd flop 338 and even flop 340. Bit 2 of DQ 110 is input to odd flop 345 and even flop 350. Bit 1 of DQ 110 is input to odd flop 355 and even flop 360. DQ even (DQ EV) bit signal 375 and DQ odd (DQ OD) bit signal 380 are output and are represented by DQ output signal 230, shown in FIG. 2.

Figure 4:
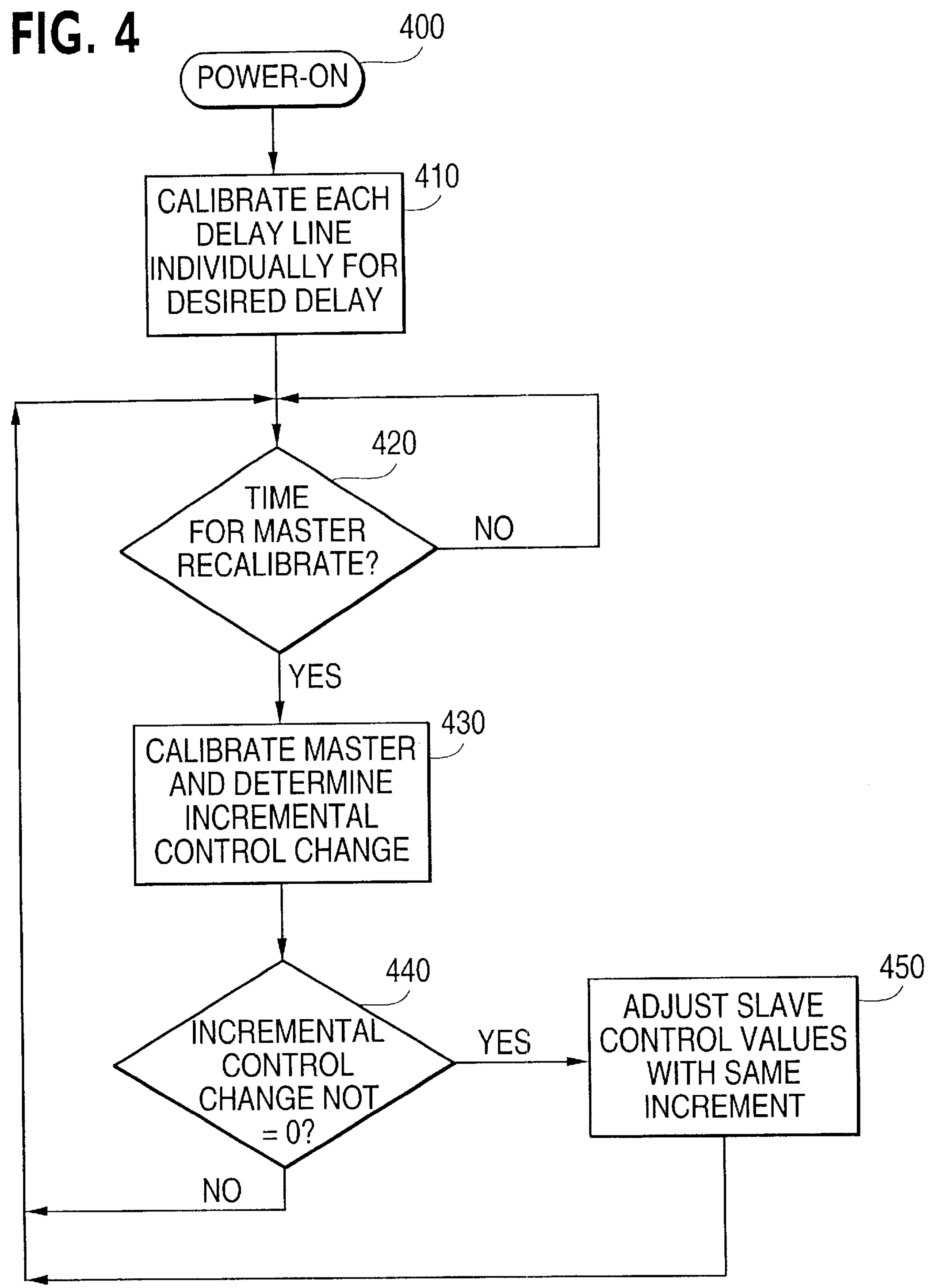
FIG. 4 is a flowchart of the process employed in an example embodiment of the present invention to calibrate the strobe delay 130.

Before proceeding into a detailed discussion of the logic used by the embodiments of the present invention it should be mentioned that the flowchart shown in FIG. 4 contains software, firmware, hardware, processes or operations that correspond, for example, to code, sections of code, instructions, commands, objects, hardware or the like, of a computer program that is embodied, for example, on a storage medium such as floppy disk, CD Rom, EP Rom, RAM, hard disk, etc. Further, the computer program can be written in any language such as, but not limited to, for example C++ or Assembler.

FIG. 4 is a flowchart of the process employed in an example embodiment of the present invention to calibrate the strobe delay 130. Processing begins in operation 400 upon initial power up of the computer system. Thereafter, processing proceeds to operation 410 where each individual slave strobe delay device 210 is calibrated to determine strobe delay 130 as previously discussed in reference to FIG. 3. Processing then proceeds to operation 420 where it is determined whether it is time for the master strobe delay device 200 to re-calibrate its associated slave strobe delay devices 210 by outputting an incremental delay adjustment signal 220. The determination of whether it is time for a master re-calibration operation to occur in operation 420 is based upon the lapse of a predetermined time interval. As would be appreciated by one of ordinary skill in the art, the determination of how much time must elapsed for such re-calibration to occur is based on the design of the circuit. If it is not time for the master strobe delay device 200 to perform a re-calibration, then processing loops back to operation 420.

Still referring to FIG. 4, if in operation 420 it is determined that a re-calibration is needed then processing proceeds to operation 430. In operation 430 the master strobe delay device 200 determines the incremental delay adjustment signal 220 as previously discussed in reference to FIG. 3. The previous control value for the variable delay element 305 is compared against the current control value for the variable delay element 305 for the master strobe delay for the master delay device 200 to determine the incremental delay adjustment 220. As previously discussed, since the master strobe delay device 200 is similar to the slave strobe delay devices 210 any change due to temperature and voltage changes in the variable delay element 305 for the master strobe delay device 200 should be the same for the slave strobe delay devices 210. Thereafter, processing proceeds to operation 440 where it is determined if the incremental delay adjustment signal 220 is not equal to zero. If the incremental delay adjustment signal 220 is equal to zero then processing loops back to operation 420. However, if the incremental delay adjustment 220 is not equal to zero then processing proceeds to operation 450. In operation 450, the incremental delay adjustment signal 220 is transmitted to the slave strobe delay devices 210 so that their respective variable delay elements 305 may be adjusted. Thereafter, processing loops back to operation 420.

The benefit resulting from the present invention is that a simple, reliable system and method is provided for calibration of DDR devices. This system and method of calibration can compensate for on-die variations in circuits due to minuscule variations in manufacturing of the circuit. Further, this system and method can periodically re-calibrate the slave strobe delay devices without interrupting their normal operations through the use of a master strobe delay device. This re-calibration function enables the adjustment of a delay strobe 130 caused by voltage and temperature changes. Therefore, a high degree of accuracy is assured for delay strobe 130. Further, the system and method allow for lower power usage delay elements to be used instead of more power demanding differential delays because the delays can be updated more often for voltage changes using the master strobe delay device.

While we have shown and described only a few examples herein, it is understood that numerous changes and modifications as known to those skilled in the art could be made to the example embodiment of the present invention. Therefore, we do not wish to be limited to the details shown and described herein, but intend to cover all such changes and modifications as are encompassed by the scope of the appended claims.

I claim:

1. A method of determining a delay strobe time for a DDR device, comprising:

- calibrating a plurality of slave strobe delay devices during system startup contained in the DDR device to determine a variable delay element;
- determining an incremental delay adjustment by a master strobe delay device at a predetermined time interval;
- transmitting the incremental delay adjustment to the plurality of slave strobe delay devices at the predetermined time interval when the incremental delay adjustment is not equal to zero; and
- updating the variable delay element contained in the plurality of slave strobe delay devices using the incremental delay adjustment received from the master strobe delay device.

2. The method recited in claim 1, wherein the master strobe delay device is connected to a plurality of slave strobe devices and are similar in design except for the slave strobe delay device receives the incremental delay adjustment from the master strobe delay device and the master strobe delay device does not output data.

3. The method recited in claim 2, wherein the calibrating a plurality of slave strobe delay devices during system startup contained in the DDR device to determine a variable delay is performed by a frequency counter.

4. The method recited in claim 3, wherein the frequency counter measures the frequency of an oscillator formed by using the slave strobe delay device and determines a current delay value of the slave strobe delay device at system startup.

5. The method recited in claim 1, wherein updating the variable delay element contained in the plurality of slave strobe delay devices using the incremental delay adjustment received from the master strobe delay device, further comprises:

- adding the incremental delay adjustment to the variable delay element;
- storing the variable delay element in the slave strobe device.

6. The method recited in claim 5, wherein the determining an incremental delay adjustment by a master strobe delay device at a predetermined time interval is performed by a frequency counter.

7. A method recited in claim 6, wherein the frequency counter measures the frequency of an oscillator formed by using the master strobe delay device and determines a current delay value of the slave strobe delay device at the predetermined interval.

8. A computer program for determining a delay strobe time for a DDR device, comprising:

- calibrating a plurality of slave strobe delay devices during system startup contained in the DDR device to determine a variable delay element;
- determining an incremental delay adjustment by a master strobe delay device at a predetermined time interval;
- transmitting the incremental delay adjustment to the plurality of slave strobe delay devices at the predetermined time interval when the incremental delay adjustment is not equal to zero; and
- updating the variable delay element contained in the plurality of slave strobe delay devices using the incremental delay adjustment received from the master strobe delay device.

9. The computer program recited in claim 8, wherein the master strobe delay device is connected to a plurality of slave strobe devices and are similar in design except for the slave strobe delay device receives the incremental delay adjustment from the master strobe delay device and the master strobe delay device does not output data.

10. The computer program recited in claim 9, wherein the calibrating a plurality of slave strobe delay devices during system startup contained in the DDR device to determine a variable delay is performed by a frequency counter.

11. The computer program recited in claim 10, wherein the frequency counter measures the frequency of an oscillator formed by using the slave strobe delay device and determines a current delay value of the slave strobe delay device at system startup.

12. The computer program recited in claim 8, wherein updating the variable delay element contained in the plurality of slave strobe delay devices using the incremental delay adjustment received from the master strobe delay device, further comprises:

- adding the incremental delay adjustment to the variable delay element;
- storing the variable delay element in the slave strobe device.

13. The computer program recited in claim 12, wherein the determining an incremental delay adjustment by a master strobe delay device at a predetermined time interval is performed by a frequency counter.

14. A computer program recited in claim 13, wherein the frequency counter measures the frequency of an oscillator formed by using the master strobe delay device and determines a current delay value of the slave strobe delay device at the predetermined interval.

15. A system for determining a delay strobe time for a DDR device, comprising:

a plurality of slave strobe delay devices calibrated at system startup to compensate for on-die variations in each individual salve strobe device of the plurality of slave strobe delay devices and storing the result of the calibration in a variable delay element; and a master strobe delay device connected to the plurality of slave strobe delay devices to determine an incremental delay adjustment at a predetermined time interval and when the incremental delay adjustment is not zero to transmit the incremental delay adjustment to each of the plurality of slave strobe delay devices, wherein upon receipt of the incremental delay adjustment by the plurality of slave strobe delay devices each slave strobe device will update the variable delay element using the incremental delay adjustment.

16. The system recited in claim 15, wherein the master strobe delay device and the plurality of slave strobe devices are similar in design except for the slave strobe delay device receives the incremental delay adjustment from the master strobe delay device and the master strobe delay device does not output data.

17. The system recited in claim 16, wherein the master strobe delay device and the slave strobe delay device each have a frequency counter to determine a variable delay.

18. The system recited in claim 17, wherein the frequency counter measures the frequency of an oscillator formed by using the slave strobe delay device or the master strobe delay device and determines a current delay value of the slave strobe delay device or the master strobe delay device.

19. The system recited in claim 18, wherein the slave strobe delay devices each slave strobe device will update the variable delay element using the incremental delay adjustment.

* * * * *